United States Patent [19]

Glover

[11] Patent Number: 4,836,792
[45] Date of Patent: Jun. 6, 1989

[54] CONNECTOR

[75] Inventor: Alfred H. Glover, Decatur, Ala.

[73] Assignee: Chrysler Motors Corporation, Highland Park, Mich.

[21] Appl. No.: 205,873

[22] Filed: Jun. 13, 1988

[51] Int. Cl.4 .......................... H01R 9/09; H01R 11/22
[52] U.S. Cl. ......................................... 439/81; 439/83; 439/876; 439/887
[58] Field of Search ..................................... 439/81–83, 439/876, 889, 889, 890

[56] References Cited

U.S. PATENT DOCUMENTS 3,697,925 10/1972 Henschen ........................... 539/17 F
4,533,188 8/1985 Miniet ................................ 439/876

Primary Examiner—P. Austin Bradley
Attorney, Agent, or Firm—Kenneth H. MacLean, Jr.

[57] ABSTRACT

An improved combination of a circuit board and mounted electrical device with means to indirectly secure the electrical device to the circuit board. A pin of the electrical device extends through an aperture in the circuit board. An electrically conductive connector overlies the circuit board and has an end portion configured to releasably grip the pin thus securing the electrical device to the circuit board. The connector also includes a tab extending through a second aperture in the circuit board adjacent an electrical pad thereon so that the tab may be soldered to the pad to both secure the connector and to provide electrical power to the pin through the connector.

7 Claims, 2 Drawing Sheets

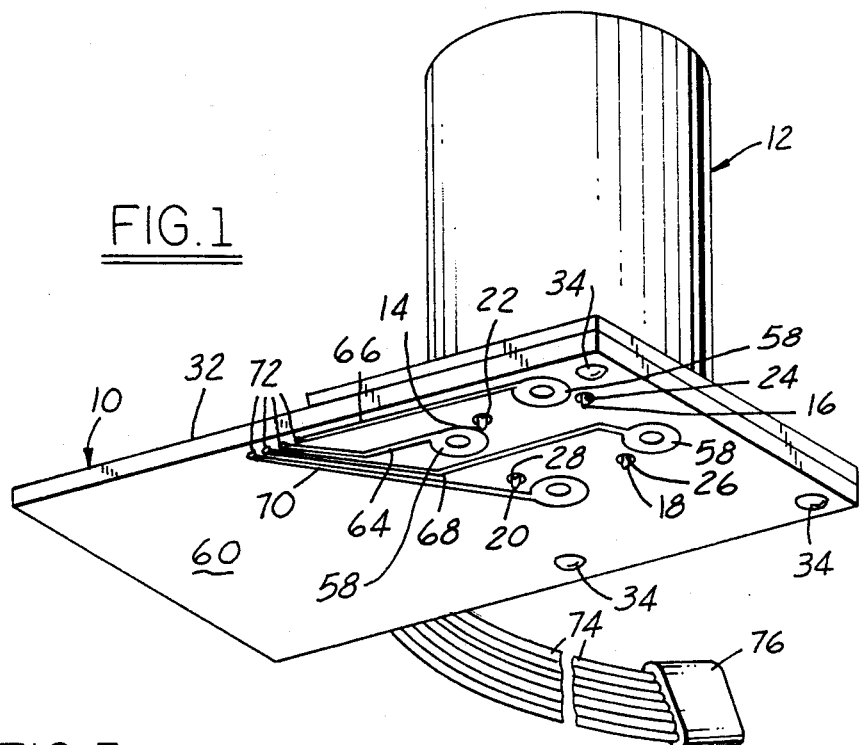
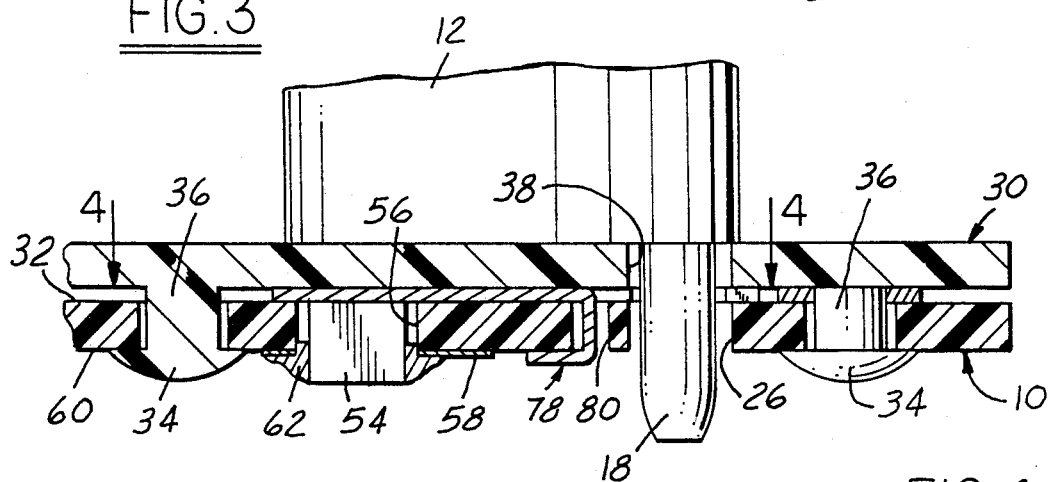
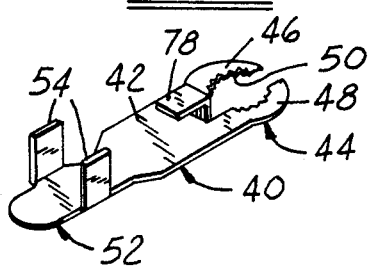
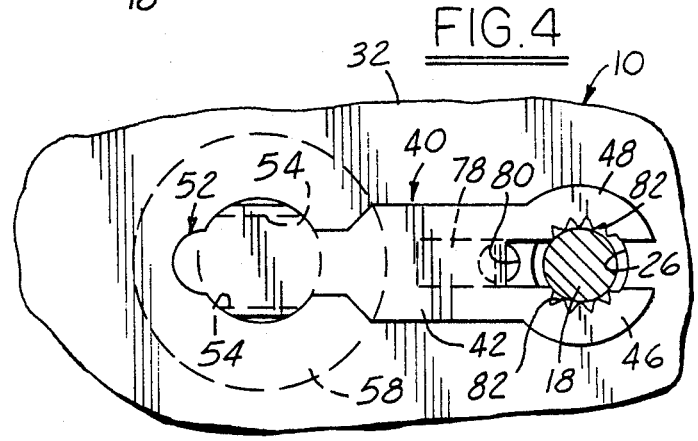

CONNECTOR

BACKGROUND OF THE INVENTION

Several means have been devised to attach an electrical device to a circuit board or the like. Originally, the thin metal leads of a transistor were attached to conductive tracks of a circuit board by soldering. This rigidly attached the device but made difficult its removal. Likewise, integrated circuits are commonly soldered to a board.

It is known to solder a receptacle to a circuit board, the receptacle having sockets formed therein to receive the leads of an integrated circuit. The resultant assembly facilitates removal of the integrated circuit.

SUMMARY OF THE INVENTION

The subject invention is an improved device for mounting an electrical device to a circuit board. Specifically, in automobile electrical odometer assemblies, it is desirable to removably mount an electric stepper motor on a circuit board. The stepper motor has pin-like leads projecting from one end. An elongated connector device is initially clipped onto the circuit board. A tab at one end of the connector projects through an aperture in the circuit board so as to be located adjacent a solder pad. Subsequently, the tab is soldered to the pad and thus the connector is secured to the board.

A bifurcated end of the connector is positioned over another aperture in the circuit board. The bifurcated end forms a pair of spaced arms adapted to receive and grip the pin of the stepper motor. This solidly mounts the stepper motor but allows it to be easily removed by the application of a force on the motor to withdraw the pin.

Accordingly, an object and advantageous feature of the improved connector and circuit board lies in the solid attachment of the connector to the board combined with the ease of attaching the motor to the connector while still allowing easy removal of the motor from the board.

Other objects, features and advantages of the present invention will be more fully apparent from the following detailed description of the preferred embodiment, the appended claims and in the accompanying drawings.

IN THE DRAWINGS

FIG. 1 is a perspective view of a pin bearing electrical device connected to a circuit board in accord with the invention; and FIG. 2 is a bottom view of the circuit board shown in FIG. 1; and FIG. 3 is a sectioned view of the device and the circuit board taken along section line 3—3 in FIG. 2 and looking in the direction of the arrows; and FIG. 4 is a sectioned view of the device taken along section line 4—4 in FIG. 3 and looking in the direction of the arrows; and FIG. 5 is a perspective view of the pin connector shown in FIGS. 2-4.

DETAILED DESCRIPTION OF AN EMBODIMENT

Figure 2:
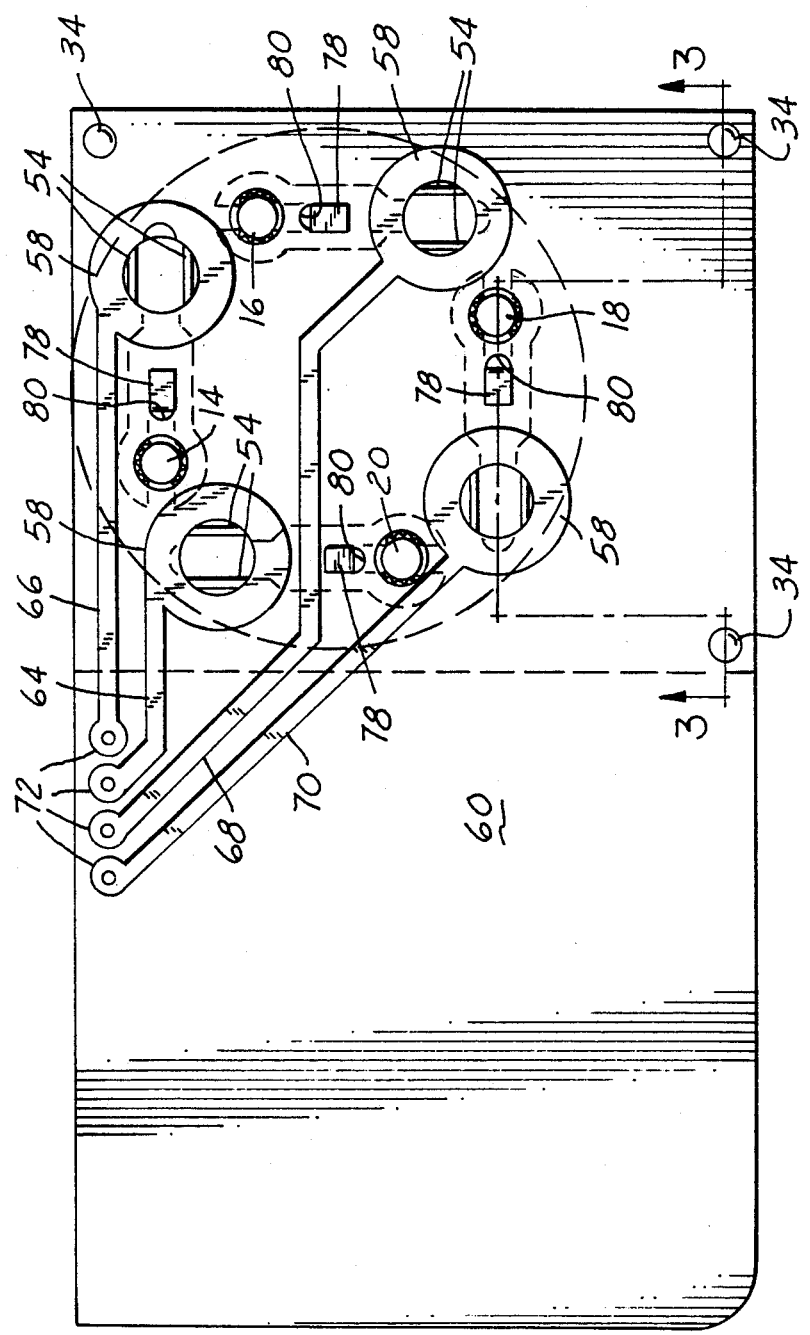

In FIGS. 1 and 2, a printed circuit board 10 is shown in association with a stepper motor 12. The stepper motor 12 has four pin members 14, 16, 18 and 20 which extend downwardly from the stepper motor and through corresponding openings 22, 24, 26 and 28 in the circuit board 10. The pins 14–20 attach the stepper motor 12 to the circuit board 10 as well as provide electrical connections thereto as will be discussed hereinafter.

A circuit board support is utilized in the form of a rigid thermal plastic plate member 30 which overlies the upper surface 32 of the circuit board 10. The plate 30 may be used to support the assembly relative to a vehicle dashboard for example. The circuit board 10 is attached to plate 30 by means of several heat staked portions 34 of projections 36 perhaps best shown in FIG. 3. In FIG. 3, the portions 34 secure the parts together by heat stacked configurations which are integrally part of the projecting stem projection 36 extending from plate 30. Further, the plate 30 may include a portion directed away from the circuit board 10 for purposes of attaching the assembly to a dashboard structure.

As previously mentioned, the pin members 14–20 of the stepper motor 12 extend through openings 22–28 in the circuit board. There are corresponding openings 38 in the plate member 30 as shown in FIGS. 3 and 4 in which one of the pins 18 is shown. The pin 18 is indirectly attached to the circuit board 10 by means of a connector assembly 40 as best shown in FIG. 5. Connector 40 has a flat body portion 42 adapted to overlie the upper surface 32 of the circuit board 10. The body 42 of connector 40 includes a bifurcated end portion 44 adapted to engage the pins 14–20. The end 44 has arms formed as curved fingers 46 and 48. The fingers 46 and 48 are curved to define a semi-circular opening 50 there between. The opening 50 receives pins 14–20 when in the assembled position. The opposite end portion 52 of the connector 40 has normally extending tabs 54 which are adapted to extend through an opening 56 in the circuit board 10 as shown in FIGS. 2 and 3. The tabs 54 are ultimately soldered to a conductive pad 58 formed on the underside 60 of the circuit board 10. A portion of the solder connection 62 is shown in FIG. 3. The conductive pads 58 and thus the pins are electrically connected by conductive tracks 64, 66, 68 and 70 of the circuit board 10 to other solder pads 72 as best shown in FIG. 2. The pads 72 are connected by a solder connection to four of seven individual wires of a ribbon type conductor 74 shown in FIG. 1. The conductor 74 is attached to a connector or an end fitting 76 which is adapted to be attached to another electrical connector (not shown). By this means, electrical power is supplied to the stepper motor 12.

The pin connector 40 is shown assembled to the circuit board 10 in FIGS. 3 and 4. Connector 40 is initially secured to board 10 thereto by use of a locator tab 78 which is adapted to extend through opening 80 in the circuit board 10 as shown in FIG. 3. The free end portion of the locator tab 78 is extending past surface 60 of board 10 then bent into overlying relation to the underside 60 of the circuit board. This secures the connector 40 to the circuit board prior to solder connecting tabs 54 to the pads 58.

In use, the connector 40 on board 10 provides a convenient and useful means to permit the pins 14–20 of the stepper motor 12 to be removably inserted through the plate 30 and to the circuit board 10. The fingers 46 and 48 of connectors 40 effectively grip the pins and secure the stepper motor 12 to the circuit board 10. The provide a better grip on the pins on the stepper motor, the fingers 46 and 48 may be configured with a series of toothed configurations 82 as illustrated in FIG. 4.1 Modifications obviously may be made to the preferred embodiment thus far described without falling outside the scope of the following claims which define the invention.

We claim:

1. In combination: an electrical device with at least one pin-like contact projecting therefrom; a flat substantially two sided circuit board with a first aperture and a second aperture extending therethrough; an electrically conductive pad formed on one side of the circuit board and adjacent the second aperture; an elongated connector member of conductive material mostly overlying a second side of the circuit board, the connector having a pin receiving end portion positioned in overlying relation to the first aperture whereby a pin is extended through the first aperture and is received by the connector thereby securing the electrical device to the circuit board; the connector also having a tab extending therefrom and through the second aperture; means securing the tab to the pad in an electrically conductive manner; conductive track means extending to the pad for supplying an electrical input to the connector.

2. The combination set forth in claim 1 in which the connector has a substantially flat body portion which extends in overlying contact with the second side of the circuit board opposite the one side supporting the pad.

3. The combination set forth in claim 1 in which the receiving end portion of the connector is bifurcated to form spaced arms extending in a plane parallel to the circuit board and defining a semi-circular aperture sized to permit insertion of the pin between the connector and the pin whereby the pin contact may be subsequently withdrawn by exertion of a sufficient great axially directed force on the electrical device in a direction away from the circuit board.

4. In the combination set forth in claim 1, the connector further having a bendable locator leg extending therefrom; the circuit board having a third aperture positioned to permit extension of the aforesaid locator leg therethrough a portion of the leg extending past the opposite side of the circuit board whereafter the locator leg is bent so that the end portion thereof overlies the circuit board to secure the connector to the circuit board prior to final connection of the tab to the pad.

5. In an odometer sub-assembly: an electrical device in the form of a stepper motor with at least one electrical pin contact projecting therefrom; a circuit board aperture and a second aperture therethrough; an electrically conductive pad carried on one side of the circuit board and adjacent the second aperture; an elongated connector member of conductive materials mostly overlying a second side of the circuit board, the connector having a pin receiving end portion which is positioned in overlying relation to the first aperture whereby a pin extended through the first aperture and received by the connector thereby securing the electrical device to the circuit board; the connector also having a tab extending therefrom and through the second aperture; means securing the tab to the pad in an electrically conductive manner; conductive track means to the pad for supplying electrical input to the connector and the pin.

6. The odometer sub-assembly set forth in claim 5 in which the end portion of the connector is bifurcated to form a pair of spaced arms defining a semi-circular aperture therebetween to grippingly receive the pin.

7. In the odometer sub-assembly as set forth in claim 5, the connector further having a bendable locator leg extending therefrom; the circuit board having a third aperture positioned to permit extension of the locator leg therethrough; a portion of the locator leg extending sufficiently past the opposite side of the circuit board so that a portion thereof can be bent into overlying relation to the opposite of the circuit board thus securing the connector to the circuit board thus securing the connector to the circuit board prior to final connection of the tab to the pad in the electrically conductive manner.

* * * * *

UNITED STATES PATENT AND TRADEMARK OFFICE

Certificate

Patent No. 4,836,792                                                                  Patented: June 6, 1989

On petition requesting issuance of a certificate for correction of inventorship pursuant to 35 USC 256, it has been found that the above-identified patent, through error and without any deceptive intent, improperly sets forth the inventorship. Accordingly, it is hereby certified that the correct inventorship of this patent is:
Alfred H. Glover, John L. Evans, Bruce Hepler Signed and Sealed this 24th Day of October 1989

GIL WEIDENFELD
*Supervisory Patent Examiner*
*Art Unit 322*